(12) United States Patent
Kim

(10) Patent No.: US 6,987,038 B2
(45) Date of Patent: Jan. 17, 2006

(54) METHOD FOR FABRICATING MOS FIELD EFFECT TRANSISTOR

(75) Inventor: Dae-Kyeun Kim, Yongin (KR)

(73) Assignee: DongbuAnam Semiconductor Inc., Seoul (KR)

( * ) Notice: Subject to any disclaimer, the term of this patent is extended or adjusted under 35 U.S.C. 154(b) by 0 days.

(21) Appl. No.: 11/024,846

(22) Filed: Dec. 30, 2004

(65) Prior Publication Data

US 2005/0142720 A1 Jun. 30, 2005

(30) Foreign Application Priority Data

Dec. 31, 2003 (KR) .................... 10-2003-0101792

(51) Int. Cl.
*H01L 21/8234* (2006.01)
(52) U.S. Cl. .................. 438/197; 438/585; 438/301
(58) Field of Classification Search ............... 438/137, 438/230, 286, 299, 301, 303, 305, 595, 548, 438/549, 585, 588
See application file for complete search history.

(56) References Cited

U.S. PATENT DOCUMENTS 6,674,139 B2 * 1/2004 Mandelman et al. ....... 257/412

* cited by examiner

*Primary Examiner*—Jack Chen
(74) *Attorney, Agent, or Firm*—Oblon, Spivak, McClelland, Maier & Neustadt, P.C.

(57) ABSTRACT

A method of fabricating a MOS field effect transistor. A gate insulating film and a gate conductive film are formed on a semiconductor substrate. The gate conductive film is patterned to form a first gate conductive film having a thin thickness and a second gate conductive film having a thick thickness. An insulating film pattern is formed on a side wall of the second gate conductive film. The insulating film pattern is used as an etching mask to remove exposed portions of the first gate conductive film and the gate insulating film. An etch process is performed to remove the insulating film pattern and a portion of the gate insulating film under the first gate conductive film. An ion implantation process is performed using the first gate conductive film as an ion implantation buffer for a lightly doped impurity region to form a source/drain region.

14 Claims, 6 Drawing Sheets

METHOD FOR FABRICATING MOS FIELD EFFECT TRANSISTOR

BACKGROUND OF THE INVENTION (a) Field of the Invention

The present invention relates to a method of fabricating a semiconductor device, and more particularly to a method of fabricating a MOS field effect transistor.

(b) Discussion of the Related Art

Known semiconductor devices have a single source/drain junction structure. Recently, as semiconductor devices become increasingly integrated, channel lengths decrease. A source/drain region having a lightly doped drain (LDD) junction structure is used to reduce undesirable effects caused by decreased channel lengths.

FIGS. 1–7 are sectional views illustrating a method of fabricating a related art MOS field effect transistor. As shown in FIG. 1, a gate insulating film pattern 111 and a gate conductive film pattern 112 are stacked sequentially on a semiconductor substrate 100. It is known to form a typical device isolation field and a well region before the gate insulating film pattern 111 and the gate conductive film pattern 112 are formed.

As shown in FIG. 2, an oxide film 121 is formed to cover the semiconductor substrate 100 and the gate conductive film pattern 112. As shown in FIG. 3, a first ion implantation process is then performed to form a first impurity region 101 by implanting impurity ions into the semiconductor substrate 100 at a low concentration.

Subsequently, an oxide film 122 is formed on the entire surface of the structure. As shown in FIG. 5, a nitride film 123 is then formed on the oxide film 122. As shown in FIG. 6, a gate spacer 126 including an oxide film pattern 124 and a nitride film pattern 125 is next formed on a side wall of the gate conductive film pattern 112 through a typical anisotropic etching process.

As shown in FIG. 7, a second ion implantation process is performed to form a second impurity region 102 by implanting impurity ions into the semiconductor substrate 100 at a high concentration, using the gate spacer 126 as an ion implantation barrier. The first and second impurity regions 101 and 102 form a source/drain region 103 having an LDD structure.

In the method of fabricating the related art MOS field effect transistor, the first and second ion implantation processes should be performed to form the source/drain region 103 having the LDD structure. Particularly, the second ion implantation process should be performed after the gate spacer 126 is formed on the side wall of the gate conductive film pattern 112. When a metal silicide film is formed on the source/drain region 103, the gate spacer 126 is also used to electrically isolate the metal silicide film from the gate conductive film pattern 112.

However, a gap between adjacent gate conductive film patterns 112 is narrowed due to the gate spacer 126. As a result, when the interlayer insulating film is formed, the gap between the adjacent gate conductive film patterns 112 may not be completely filled with the interlayer insulating film, such that voids are generated.

The voids act as cracks and bridges deteriorating reliability of the device through subsequent thermal and contact processes. For example, in a SRAM, which has a low operation voltage and in which leakage current characteristics are critical, a silicide process may not be performed. In this case, the gate spacer 126 is used only as the ion implantation barrier.

SUMMARY OF THE INVENTION

To address the above-described and other problems, it is an object of the present invention to provide a method of fabricating a MOS field effect transistor. A gate insulating film and a gate conductive film are formed on a semiconductor substrate. The gate conductive film is patterned to form a first gate conductive film having a thin thickness and a second gate conductive film having a thick thickness. An insulating film pattern is formed on a side wall of the second gate conductive film. The insulating film pattern is used as an etching mask to remove exposed portions of the first gate conductive film and the gate insulating film. An etch process is performed to remove the insulating film pattern and a portion of the gate insulating film under the first gate conductive film. An ion implantation process is performed using the first gate conductive film as an ion implantation buffer for a lightly doped impurity region to form a source/drain region.

It is to be understood that both the foregoing general description of the invention and the following detailed description are exemplary, but are not restrictive of the invention.

BRIEF DESCRIPTION OF THE DRAWINGS

The accompanying drawings, which are incorporated in and constitute a part of the specification, illustrate an embodiment of the invention, and, together with the description, serve to explain the principles of the invention.

DETAILED DESCRIPTION OF THE INVENTION

Embodiments of the present invention are described with reference to the accompanying drawings. It is to be understood that the invention is not limited to the disclosed embodiments, but rather is intended to cover various modifications and arrangements within the scope of the claims.

FIGS. 8–14 are sectional views illustrating a method of fabricating a MOS field effect transistor according to the present invention.

Figure 1:
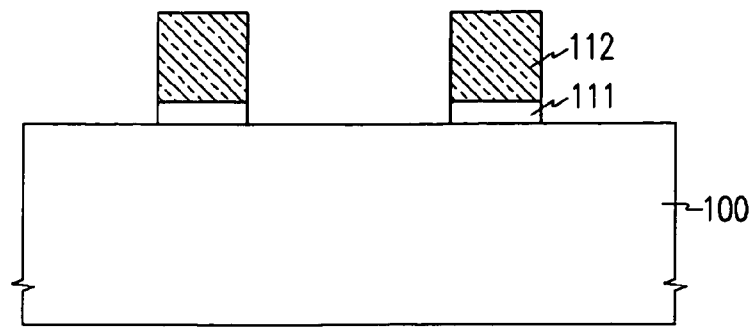
FIGS. 1–7 are sectional views illustrating a method of fabricating a related art MOS field effect transistor.
Figure 2:
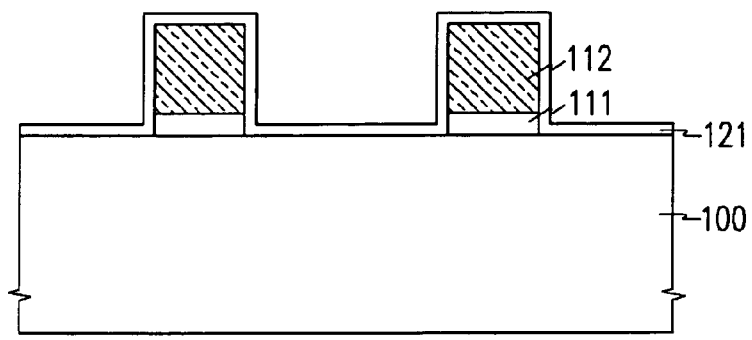
Figure 3:
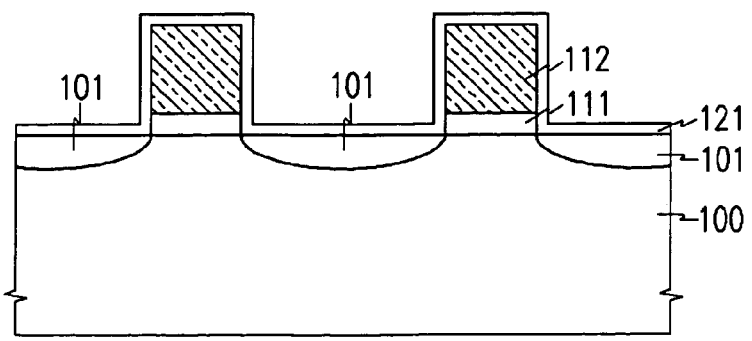
Figure 4:
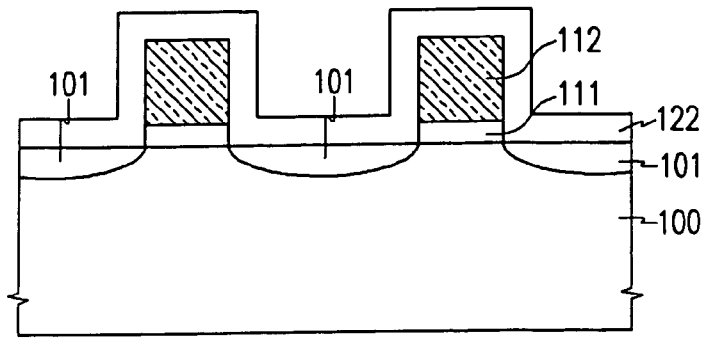
Figure 5:
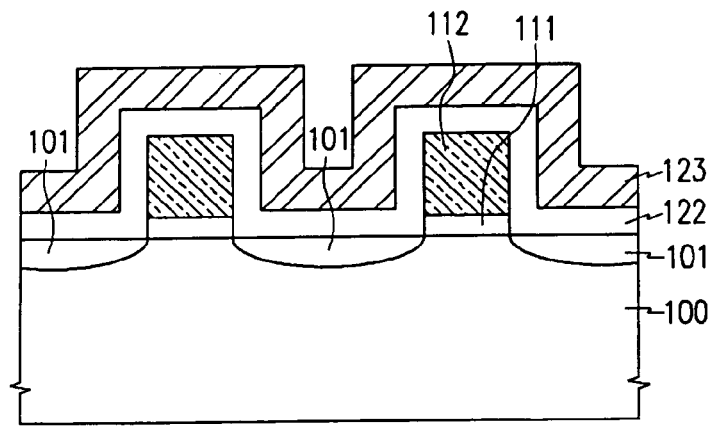
Figure 6:
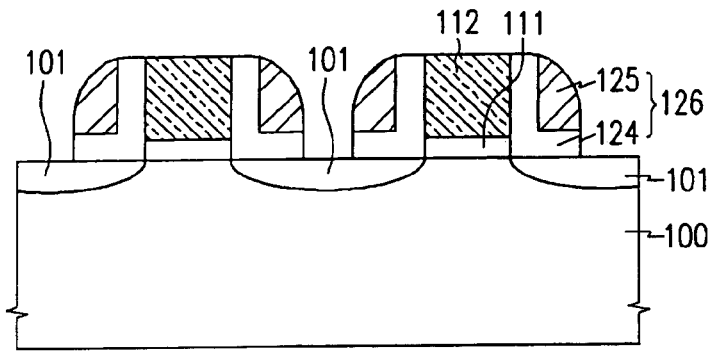
Figure 7:
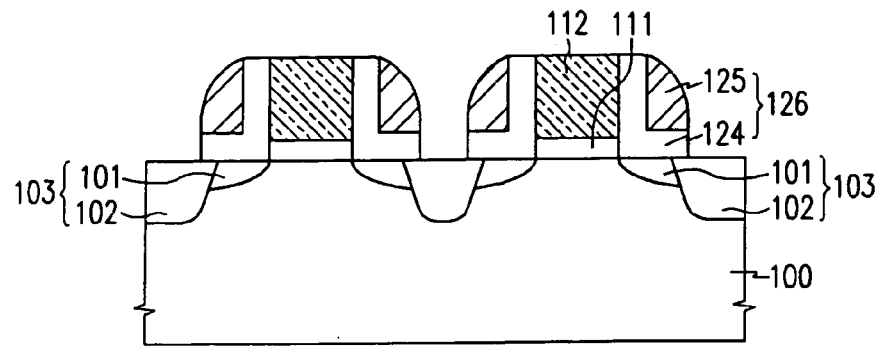
Figure 8:
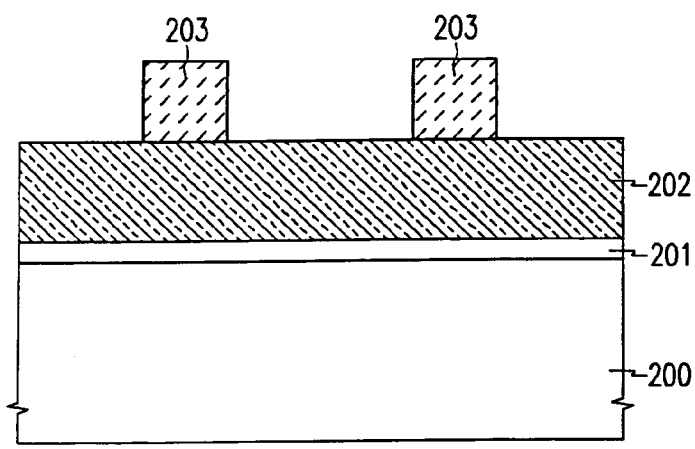
FIGS. 8–14 are sectional views illustrating a method of fabricating a MOS field effect transistor according to the present invention.

As shown in FIG. 8, a gate insulating film 201 and a gate conductive film 202 are formed on a semiconductor substrate 200. Preferably, the films 201 and 202 are sequentially formed. In a preferred embodiment, the gate insulating film 201 is formed from an oxide film and the gate conductive film 202 is formed from a polysilicon film.

A mask pattern 203, which is used to pattern the gate conductive film 202, is formed on the gate conductive film 202. The mask pattern 203 acts as a photoresist pattern.

Figure 9:
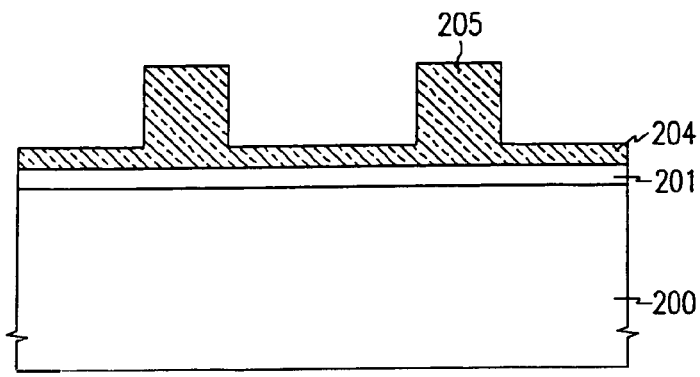

As shown in FIG. 9, an exposed portion of the gate conductive film 202 is removed by performing an etching process using the mask pattern 203 as an etching mask. At this time, the exposed portion of the gate conductive film 202 is not completely removed, such that a thickness of the gate conductive film 202 remains. Through the etching process, the gate conductive film is divided into two films, including a first gate conductive film 204 having a relatively thin thickness in a portion exposed by the mask pattern 203, and a second gate conductive film 205 having a relatively thick thickness in a portion covered with the mask pattern 203.

The thickness of the first gate conductive film 204 is determined by a predetermined impurity concentration and junction depth of a lightly doped impurity region, formed in a subsequent process.

Figure 10:
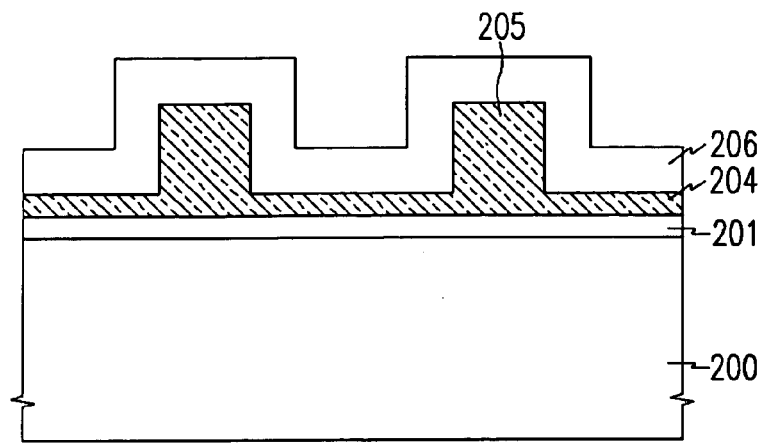

As shown in FIG. 10, an oxide film 206 is formed on the first and second gate conductive films 204 and 205. At this time, the thickness of the oxide film 206 is determined by a diffusion length in a horizontal direction of the lightly doped impurity region composing a source/drain region to be formed. Specifically, the first gate conductive film 204 remains with a length corresponding to the thickness of the oxide film 206 in a subsequent process. This remaining first gate conductive film 204 is used as an ion implantation buffer for forming the lightly doped impurity region. Accordingly, the length of the lightly doped impurity region is determined by the length of the first gate conductive film 204, which is determined by the thickness of the oxide film 206.

Figure 11:
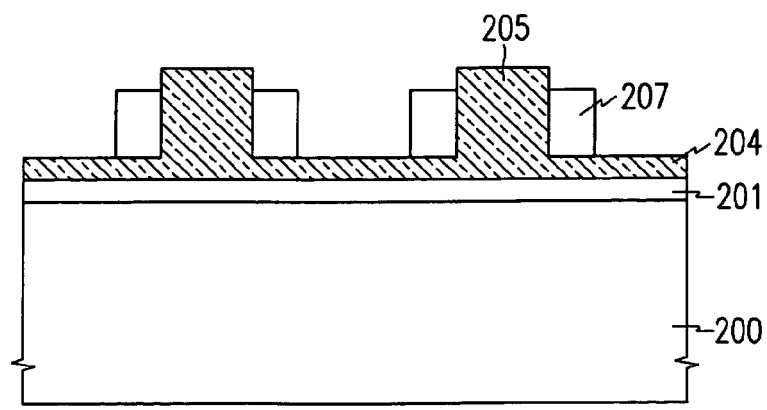

As shown in FIG. 11, an oxide film pattern 207, which exposes a portion of a surface of the first gate conductive film 204 and a top surface of the second gate conductive film 205, is formed by etching an entire surface of the oxide film 206. At this time, an elevation of the top surface of the second gate conductive film 205 is higher than an elevation of the top surface of the oxide film pattern 207, and a difference in height between the top surface of the second gate conductive film 205 and the top surface of the oxide film pattern 207 corresponds to a thickness of the first gate conductive film 204.

The above etching operation can be performed using an anisotropic etching process, for example, an etch back process, or alternatively, other anisotropic etching processes.

Figure 12:
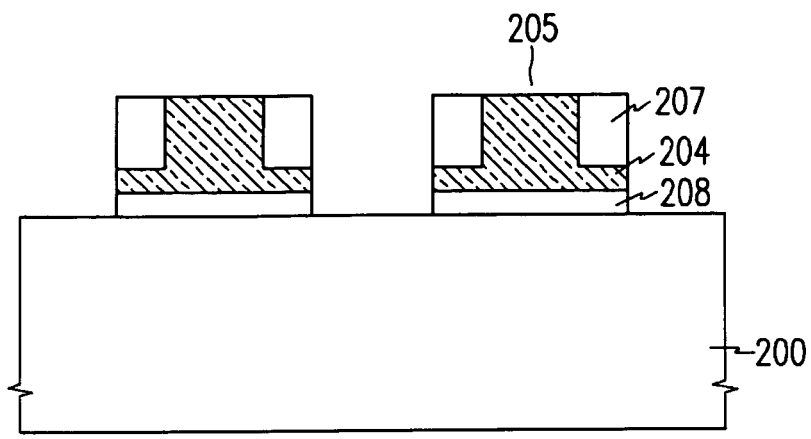

As shown in FIG. 12, a portion 208 of a surface of the gate insulating film 201 is exposed by performing an etching process for the exposed portion of the first gate conductive film 204. A portion of the surface of the semiconductor substrate 200 is exposed by performing an etching process for the exposed portion of the gate insulating film 201. Simultaneously, a projecting top portion of the second gate conductive film 205 is removed by performing the same etching process for the exposed portion of the first gate conductive film 204.

Figure 13:
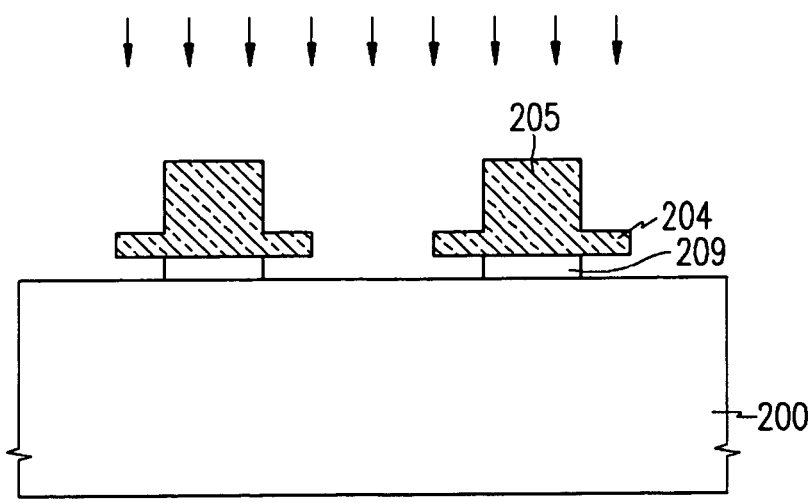
Figure 14:
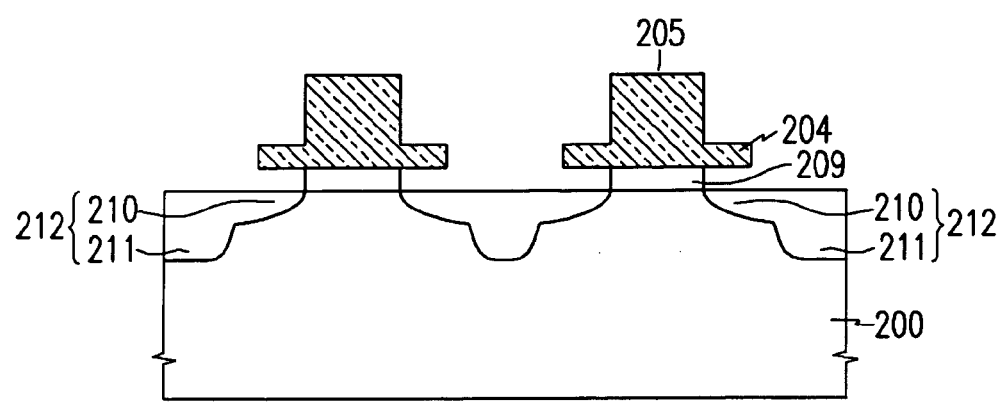

As shown in FIG. 13, the oxide film pattern 207 is removed, such as by a wet etching process. At this time, a portion of the gate insulating film under the first gate conductive film 204 is also removed to provide a gate insulating film pattern 209 formed only under the second gate conductive pattern. As shown by the arrows in FIG. 13, impurity ions are implanted into the entire surface of the structure. At this time, the first gate conductive film 204 is used as the ion implantation buffer of the lightly doped impurity region. Thereafter, when an ion diffusion process is performed after the ion implantation process, a source/drain region 212 including a lightly doped impurity region 210 and a heavily doped impurity region 211 is formed, as shown in FIG. 14.

Alternatively, as the gate insulating film under the first gate conductive film 204 is removed, the lightly doped impurity region 210 is spaced from the first gate conductive film 204. Accordingly, impurity ions in the lightly doped impurity region 210 are not diffused into the first gate conductive film 204.

As is apparent from the above description, with the method of fabricating a MOS field effect transistor according to the present invention, since a source/drain region having a LDD structure can be simply formed by performing an ion implantation process only once. In addition, since a gate spacer need not be formed, voids are not generated in an insulating film between gates.

Although embodiments of the present invention have been described in detail, it should be clearly understood that many variations and/or modifications of the basic invention concepts herein taught which may appear to those skilled in the present art are within the spirit and scope of the present invention, as defined in the claims.

This application incorporates by reference herein in its entirety, Korean Application Serial No. 10-2003-0101792, filed on Dec. 31, 2003.

What is claimed is:

1. A method of fabricating a MOS field effect transistor, comprising:
   forming a gate insulating film and a gate conductive film on a semiconductor substrate;
   patterning the gate conductive film to form a first gate conductive film having a first thickness in a first region and a second gate conductive film having a second thickness in a second region, the second thickness greater than the first thickness;
   forming an insulating film pattern on a side wall of the second gate conductive film;
   using the insulating film pattern as an etching mask during an etch process to remove exposed portions of the first gate conductive film; and
   performing an ion implantation process using the first gate conductive film as an ion implantation buffer of a lightly doped impurity region to form a source/drain region including the lightly doped impurity region and a heavily doped impurity region on the semiconductor substrate.

2. The method according to claim 1, wherein the step of forming an insulating film pattern uses an oxide film.

3. The method according to claim 2, wherein the step of forming an insulating film pattern comprises:
   forming the oxide film on the first gate conductive film and the second gate conductive film; and
   performing an anisotropic etch to form an oxide film pattern on a side wall of the second gate conductive film.

4. The method according to claim 1, wherein during the step of forming an insulating film pattern, a thickness of the insulation film pattern corresponds to a predetermined length of the lightly doped impurity region.

5. The method according to claim 1, wherein during the step of patterning the gate conductive film, a thickness of the first conductive film corresponds to a predetermined impurity concentration and junction depth of the lightly doped impurity region.

6. The method according to claim 1, wherein during the step of forming a gate insulating film and the gate conductive film, the gate insulating and gate conductive films are sequentially formed.

7. The method according to claim 1, wherein during the step of using the insulating film pattern, the first gate conductive film and the gate insulating film are sequentially removed.

8. A method of fabricating a MOS field effect transistor, comprising:
   step for forming a gate insulating film and a gate conductive film on a semiconductor substrate;
   step for patterning the gate conductive film to form a first gate conductive film having a first thickness in a first region and a second gate conductive film having a second thickness in a second region, the second thickness greater than the first thickness;

step for forming an insulating film pattern on a side wall of the second gate conductive film;

step for using the insulating film pattern as an etching mask during an etch process to remove exposed portions of the first gate conductive film and the gate insulating film;

step for performing an etch process to remove the insulating film pattern and a portion of the gate insulating film under the first gate conductive film; and step for performing an ion implantation process using the first gate conductive film as an ion implantation buffer of a lightly doped impurity region to form a source/drain region including the lightly doped impurity region and a heavily doped impurity region on the semiconductor substrate.

9. The method according to claim 8, wherein the step for forming an insulating film pattern uses an oxide film.

10. The method according to claim 9, wherein the step for forming an insulating film pattern comprises:

step for forming the oxide film on the first gate conductive film and the second gate conductive film; and step for performing an anisotropic etch to form an oxide film pattern on a side wall of the second gate conductive film.

11. The method according to claim 8, wherein during the step for forming an insulating film pattern, a thickness of the insulation film pattern corresponds to a predetermined length of the lightly doped impurity region.

12. The method according to claim 8, wherein during the step for patterning the gate conductive film, a thickness of the first conductive film corresponds to a predetermined impurity concentration and junction depth of the lightly doped impurity region.

13. The method according to claim 8, wherein during the step for forming a gate insulating film and the gate conductive film, the gate insulating and gate conductive films are sequentially formed.

14. The method according to claim 8, wherein during the step for using the insulating film pattern, the first gate conductive film and the gate insulating film are sequentially removed.

* * * * *